United States Patent
Tsai et al.

(10) Patent No.: US 9,825,601 B2
(45) Date of Patent: Nov. 21, 2017

(54) DIFFERENTIAL TWO-STAGE AMPLIFIER AND OPERATION METHOD THEREOF

(71) Applicant: Winbond Electronics Corp., Taichung (TW)

(72) Inventors: Tsung-Fu Tsai, Keelung (TW); Herming Chiueh, Taipei (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/684,691

(22) Filed: Apr. 13, 2015

(65) Prior Publication Data
US 2016/0079931 A1  Mar. 17, 2016

(30) Foreign Application Priority Data
Sep. 16, 2014  (TW) .............................. 103131852 A

(51) Int. Cl.
*H03F 3/45* (2006.01)
(52) U.S. Cl.
CPC ....... *H03F 3/45192* (2013.01); *H03F 3/4565* (2013.01); *H03F 3/45475* (2013.01); *H03F 2203/45112* (2013.01); *H03F 2203/45134* (2013.01); *H03F 2203/45284* (2013.01); *H03F 2203/45286* (2013.01)
(58) Field of Classification Search
CPC ................................................. H03F 3/45076

USPC ................................................. 330/253, 258
See application file for complete search history.

(56) References Cited

U.S. PATENT DOCUMENTS

| 5,008,632 A | 4/1991 | Sutterlin |
| 8,575,971 B1 | 11/2013 | Chamakura |

OTHER PUBLICATIONS

Taiwanese Office Action dated Jan. 18, 2016, as issued in corresponding Taiwan Patent Application No. 103131852 (8 pages).
(Continued)

*Primary Examiner* — Khanh V Nguyen
*Assistant Examiner* — Khiem Nguyen
(74) *Attorney, Agent, or Firm* — Muncy, Geissler, Olds & Lowe, P.C.

(57) ABSTRACT

A differential two-stage amplifier is provided. The differential two-stage amplifier includes an input circuit, a bias circuit, a common mode feedback circuit, a first stage amplifier, a second stage amplifier and a current compensation circuit. The input circuit receives an input current. The bias circuit provides a bias current. The first stage amplifier is coupled to the input circuit and the second stage amplifier. The common mode feedback circuit is coupled to the second stage amplifier and adjusts a common mode feedback current according to a common mode voltage, wherein the input current is made up of the bias current and the common mode feedback current. The current compensation circuit provides a compensation current, wherein when a temperature of the differential two-stage amplifier is greater than a predetermined temperature, the compensation current is input to the input circuit.

10 Claims, 14 Drawing Sheets

(56) References Cited

OTHER PUBLICATIONS

Ivan Koudar, "Variable gain differential current feedback amplifier", in Custom Integrated Circuits Conference, Oct. 3-6 2004, Proceedings of the IEEE 2004, pp. 659-662.

Ahmed H. Madian, et al., "Low voltage CMOS fully differential current feedback amplifier with controllable 3-dB bandwidth" in Microelectronics International Conference, Dec. 29-31, 2007, pp. 7-10.

Antonio J. Gano, et al., "New fully differential variable gain instrumentaion amplifier based on DDA topology", in Instrumentation and Measurement Technology Conference, Proceedings of the $16^{th}$ IEEE, vol. 1, 1999, pp. 60-64.

DIFFERENTIAL TWO-STAGE AMPLIFIER AND OPERATION METHOD THEREOF

CROSS REFERENCE TO RELATED APPLICATIONS

This Application claims priority of Taiwan Patent Application No. 103131852, filed on Sep. 16, 2014, the entirety of which is incorporated by reference herein.

BACKGROUND OF THE INVENTION

Field of the Invention

The present invention relates to a differential amplifier and more particularly to a differential two-stage amplifier with current compensation mechanism at high temperature condition.

Description of the Related Art

When the process advances to 90 nm, 45 nm or even to 28 nm, the heat generated due to the power consumption causes a high temperature variation to a micro integrated circuit. The integrated circuit is significantly affected by the temperature variation, especially to the circuits that require precisely measurements, such as a temperature sensor. The high temperature influence needs to be avoided.

BRIEF SUMMARY OF THE INVENTION

An embodiment of the invention provides a differential two-stage amplifier. The differential two-stage amplifier comprises an input circuit, a bias circuit, a common mode feedback circuit, a first stage amplifier, a second stage amplifier and a current compensation circuit. The input circuit receives an input current. The bias circuit provides a bias current. The first stage amplifier is coupled to the input circuit and the second stage amplifier. The common mode feedback circuit is coupled to the second stage amplifier and adjusts a common mode feedback current according to a common mode voltage, wherein the input current is made up of the bias current and the common mode feedback current. The current compensation circuit provides a compensation current, wherein when a temperature of the differential two-stage amplifier is greater than a predetermined temperature, the compensation current is input to the input circuit.

Another embodiment of the invention provides an operational method for a differential two-stage amplifier. The method includes steps of calculating a threshold temperature of a common mode feedback circuit of a differential two-stage amplifier; estimating a compensation current according to the threshold temperature; providing a common mode feedback current to an input circuit of the differential two-stage amplifier when a temperature of the differential two-stage amplifier is lower than the threshold temperature; stopping providing the common mode feedback current to the input circuit and receiving a compensation current, by the input circuit, from a current compensation circuit.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The temperature is an important parameter to affect the performance of a circuit. With the advance of the manufacture process, the size of the integrated circuit becomes smaller and integrated circuit is significantly affected by heat accordingly. The performance of the circuit becomes worse and the circuit may be unworkable in the worst condition.

Take the MOSFET for example, the current in the saturation region can be expressed as following:

$$I_D = \frac{1}{2} \times \mu \times C_{OX} \times \frac{W}{L} \times (V_{GS} - V_T)^2 \times (1 + \lambda V_{DS}), \quad (2.1)$$

wherein the nobility $\mu$ and the threshold voltage $V_T$ can be affected by the temperature.

$$\mu(T) = \mu(T_0) \times \left(\frac{T}{T_0}\right)^{\gamma_\mu} \quad (2.2)$$

$$V_T \approx V_{T0} - \alpha \Delta T \quad (2.3)$$

$$\Delta V_T \approx \alpha \Delta T \quad (2.4)$$

According to the equation 2.2, we can find that the nobility μ(T) is a constant value μ(T0) at the temperature T0, and the nobility μ(T) varies with ₓμ-th power of (T/T0).

Generally speaking, the variation between the threshold voltage $V_T$ and the temperature is linear, wherein α is a temperature parameter. The value of α varies according to the manufacture process. For example, in the 1.8 μm process, the value of α is 0.00017 V/° C., and the value of α is 0.05 V/° C. in the 90 nm process. It can be found that the temperature affect becomes more seriously due to the advance manufacture process.

To the amplifier for example. The amplifier circuit is one of the common and important circuits, and transistors of the amplifier are biased in the saturation region for a large magnification ratio. When VGS is fixed, the current $I_D$ is proportional to the square of the voltage difference between the threshold voltage $V_T$ and voltage VGS. When the temperature rises to a threshold, the transistors of the amplifier enter to a linear region from the saturation region and the magnification ratio decreases accordingly. In the worst condition, the amplifier cannot work anymore. The same situation may also occur in the differential two-stage amplifier.

Figure 1:
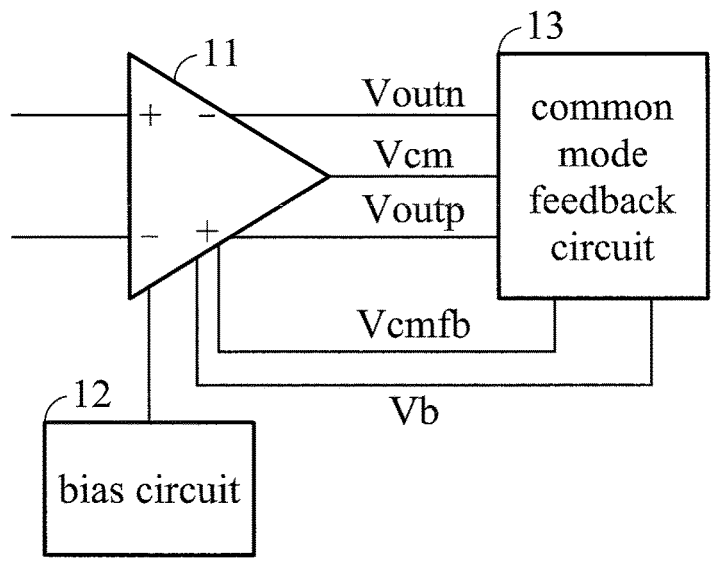
FIG. 1 is a schematic diagram of a differential two-stage amplifier.
Figure 2:
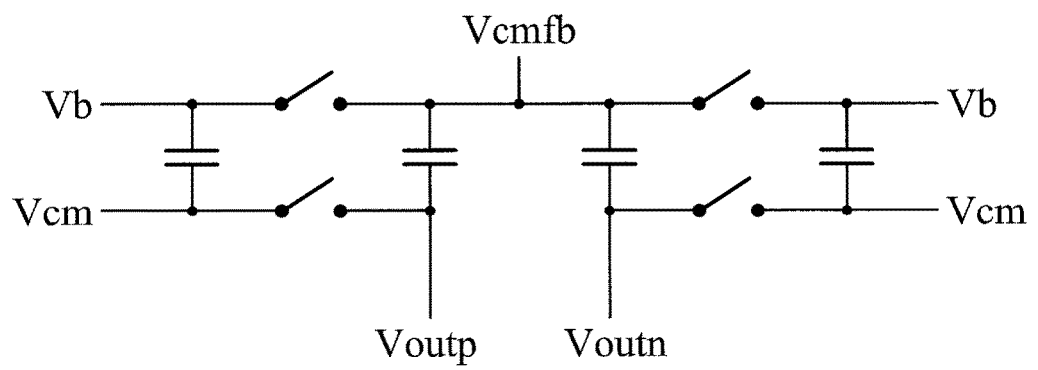
FIG. 2 is a schematic diagram of a common mode feedback circuit.

FIG. 1 is a schematic diagram of a differential two-stage amplifier. The differential two-stage amplifier comprises a dual output amplifier 11, a common mode feedback circuit 13 and a bias circuit 12. The bias circuit 12 is made up of a bandgap circuit and a current generation circuit to bias the dual output amplifier 11. The common mode feedback circuit 13, such as shown in FIG. 2, is a common technology applied to the differential two-stage amplifier. The common mode feedback circuit 13 detects a variation of the voltage level of the common mode voltage (Vcm) of the output terminals of the dual output amplifier 11 and adjusts the input current of input stage of the dual output amplifier 11 to avoid the differential two-stage amplifier affecting by the temperature. The common mode voltage (Vcm) is provided by at least one external circuit.

When the temperature is too high, such as more than 100° C., the common mode feedback circuit 13 cannot provide enough current to adjust the input current of the differential two-stage amplifier. Thus, the biasing point of the output voltage of the dual output amplifier 11 cannot be controlled and thus, the dual output amplifier 11 cannot work normally.

Figure 3:
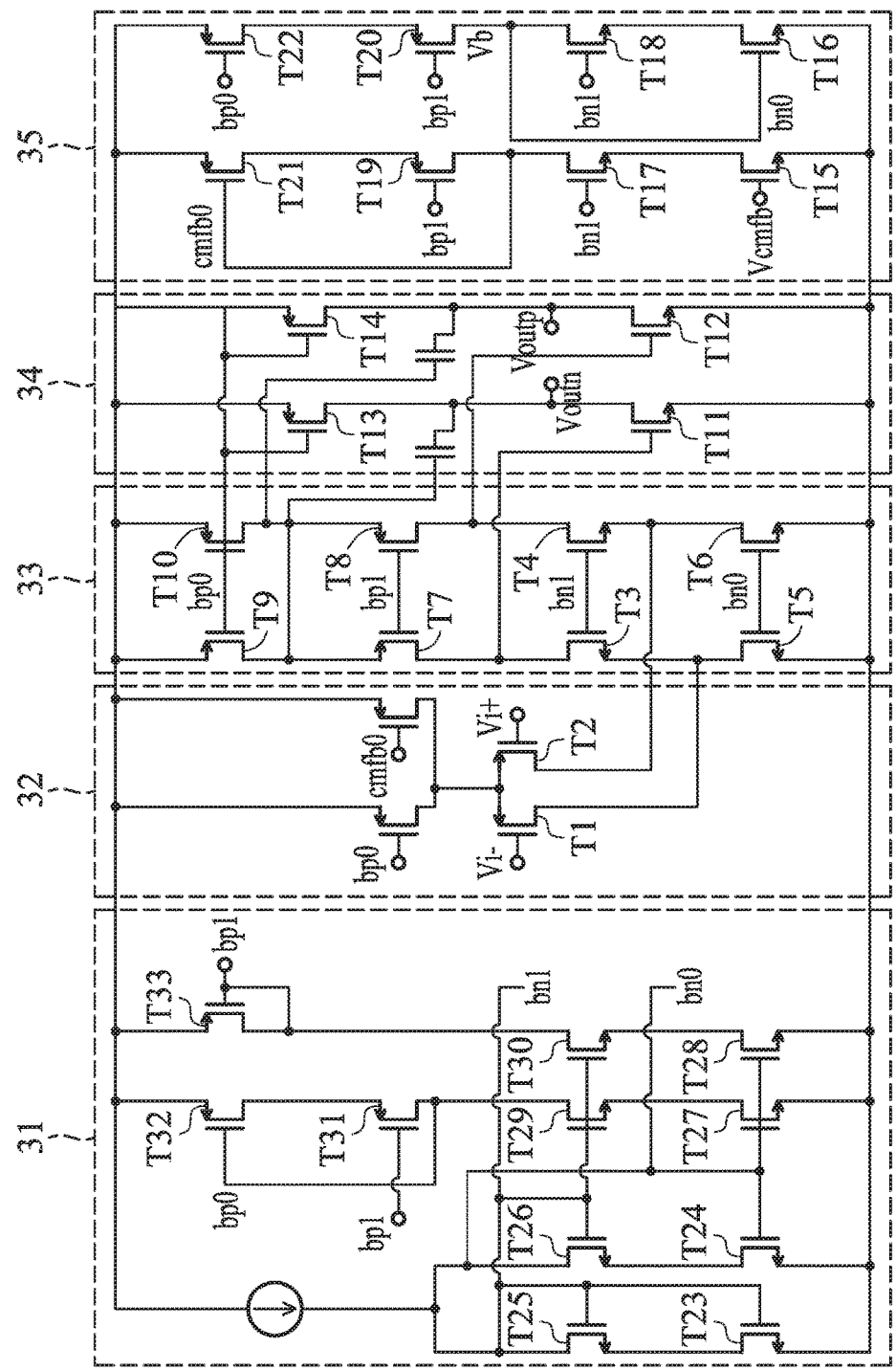
FIG. 3 is a circuit diagram of a differential two-stage amplifier.

FIG. 3 is a circuit diagram of a differential two-stage amplifier. The differential two-stage amplifier comprises a bias circuit 31, an input circuit 32, a first stage amplifier 33, a second stage amplifier 34 and a common mode feedback circuit 35. The bias circuit 31 generates different bias currents by the way of the current mirror. The bias currents are transmitted to circuits, such as the input circuit 32. The first stage amplifier 33 is a cascade amplifier to amplifier the input signals Vi+ and Vi−. Because the cascade amplifier has a higher magnification ratio and a signal swing of the input signal can be increased. The second stage amplifier 34 is a common source amplifier to adjust a bias current Icmfb0 of the first stage amplifier 33 according to the common mode voltage Vcmfb.

The bias circuit 31 generates a constant bias voltage according to a constant current source. Since the bias circuit 31 is biased by the constant current, voltages $V_{GS}$ and $V_{DS}$ vary to ensure the current would not vary when the $V_T$ changes. The voltage of the bias amplifier changes due to the change of $V_T$. According to the equation (2.1), the voltage of four nodes of the differential two-stage amplifier in FIG. 3 can be referred to FIGS. 4a and 4b.

Figure 4A:
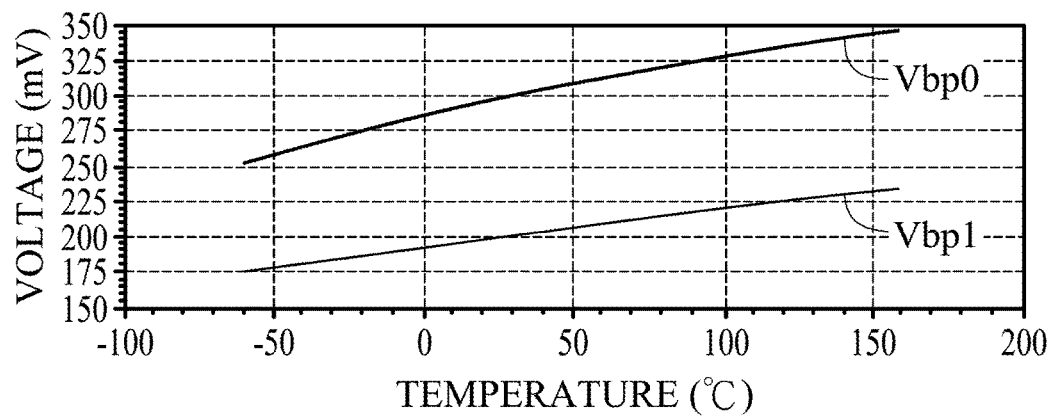
FIGS. 4A and 4B are schematic diagrams show voltage variations of four nodes of the differential two-stage amplifier of FIG. 3.
Figure 4B:
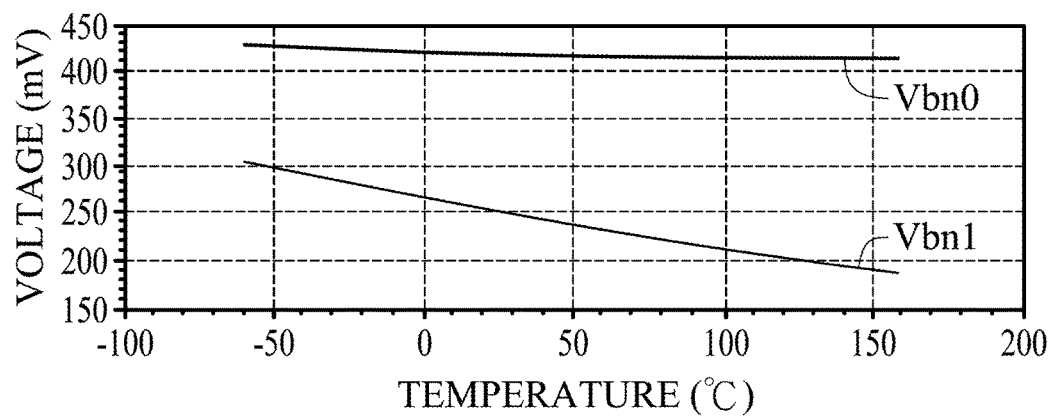

FIGS. 4a and 4b are a schematic diagrams show voltage variations of four nodes of the differential two-stage amplifier of FIG. 3. The voltage of each node is shown in following:

$$V_{bp0} = V_{G32} = V_{DD} - V_{Tp} - \sqrt{\frac{2I_{D32}}{(1+\lambda V_{DS32}) \cdot \mu_P C_{OX}} \cdot \frac{L_{32}}{W_{32}}} \quad (3.15)$$

$$V_{bp1} = V_{G33} = \quad (3.16)$$
$$V_{DD} - V_{GS32} = V_{DD} - V_{Tp} - \sqrt{\frac{2I_{D33}}{(1+\lambda V_{DS33}) \cdot \mu_P C_{OX}} \cdot \frac{L_{33}}{W_{33}}}$$

$$V_{bn0} = V_{GS24} = V_{Tn} + \sqrt{\frac{2I_{D24}}{(1+\lambda V_{DS24}) \cdot \mu_u C_{OX}} \cdot \frac{L_{24}}{W_{24}}} \quad (3.17)$$

$$V_{bn1} = \quad (3.18)$$
$$V_{G26} = V_{GS26} + V_{DS24} = V_{Tn} + \sqrt{\frac{2I_{D26}}{(1+\lambda V_{DS26}) \cdot \mu_u C_{OX}} \cdot \frac{L_{26}}{W_{26}}} + \frac{1}{\lambda}\left(\frac{2I_{D24}}{(V_{GS24}-V_{Tn})^2 \cdot \mu_u C_{OX}} \cdot \frac{L_{24}}{W_{24}}\right)$$

According to equations above, all the voltages of the four nodes contain the parameter $V_T$. Under the premise of the constant current, the values in the radical sign is only affected by the temperature parameter μ, but the temperature parameter μ is not obviously affected by the temperature. Thus, the voltage variations of the four nodes are substantially linear.

According to the FIGS. 4a and 4b, voltages $V_{bp0}$ and $V_{bp1}$ increase when the temperature increases, and voltages $V_{bn0}$ and $V_{bn1}$ decrease when the temperature increases. The variation magnitude of voltage $V_{bp0}$ is similar to the variation magnitude of voltage $V_{bp1}$. The variation magnitude of voltage $V_{bn1}$ is greater than the variation magnitude of voltage $V_{bn0}$ due to the channel length modulation effect.

From the FIGS. 4a and 4b, the voltage variations of $V_{bp0}$, $V_{bp1}$, $V_{bn0}$ and $V_{bn1}$ are not obvious, thus, effect of the temperature to the voltage of these biasing node is limited.

In the circuit of FIG. 3, the input voltage is a constant voltage (VDD/2), and the input stage has two input current source. One is the biasing current generated by the bias circuit 31, and another is the feedback current provided by the common mode feedback circuit 35. Then, we can observer the variation of currents related to the input stage according to the voltage variation shown in FIGS. 4a and 4b. The input current $I_1$ passing through the transistor T1 is repressed as following:

$$I_1 I_{bp0} + I_{cmfb0}$$

Figure 5A:
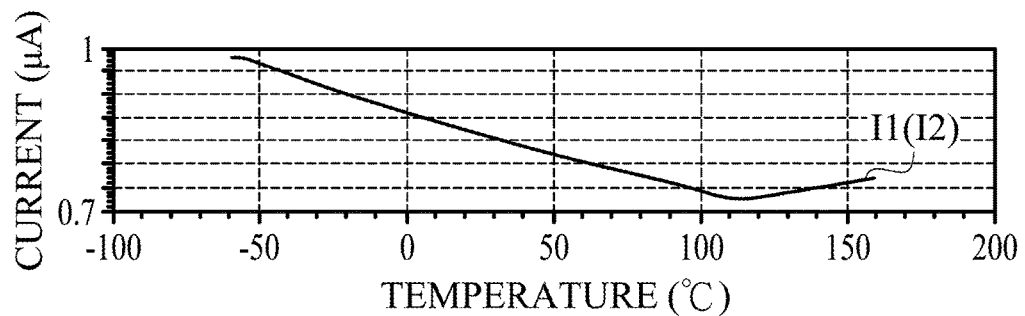
FIGS. 5A, 5B, and 5C are schematic diagrams showing variations between current and temperature of the differential two-stage amplifier of FIG. 3.
Figure 5B:
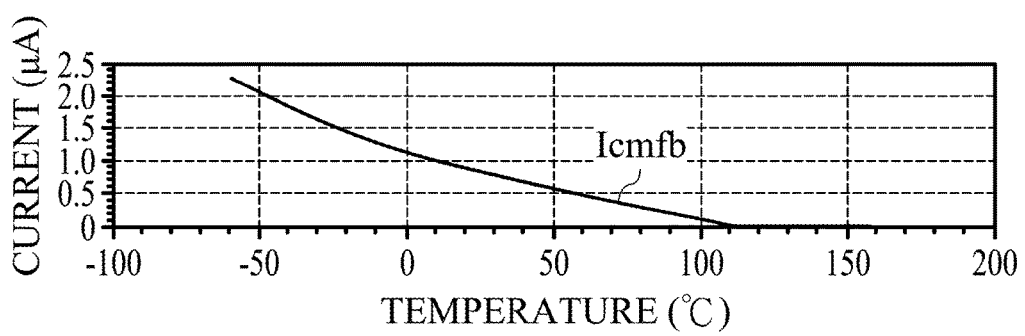
Figure 5C:
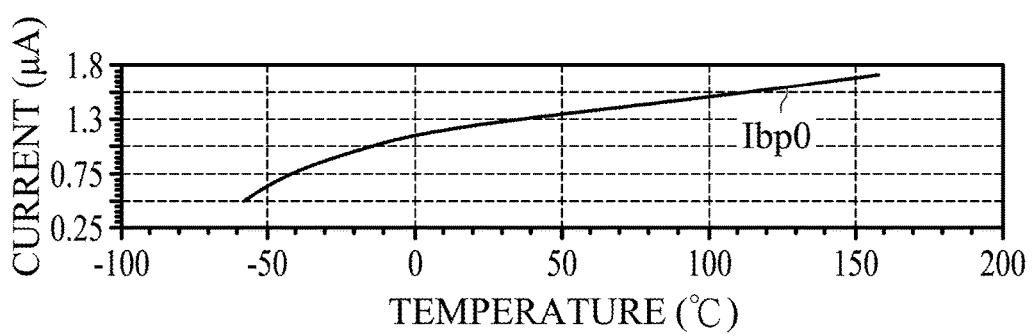

FIG. 5A~5C are schematic diagrams showing variations between current and temperature of the differential two-stage amplifier of FIG. 3. In FIG. 5B, it is obvious that the current $I_{cmfb0}$ provided by the common mode feedback circuit 35 is almost zero when the temperature is greater than 110° C. Although the current $I_{bp0}$ increases when the temperature increase, but the reduced magnitude of the current $I_1(I_2)$ due to the feedback current $I_{cmfb0}$, such as shown in FIG. 5A, cannot be compensated.

In FIG. 5C, it can be found that the current $I_{bp0}$ cannot be a constant current by the current mirror mechanism even though the input common mode voltage provided by the common mode feedback circuit is fixed. The current $I_{bp0}$ decreases due to the threshold voltage $V_T$ affected by the temperature. Furthermore, the common mode feedback circuit adjusts the feedback current $I_{cmfb0}$ to limit the magnitude of input current input to the input stage, thus, the voltage variation is limited, wherein the adjustment of the current varies according to the degree of effect that the voltage is affected by the temperature, wherein the effect is usually related to the manufacture process.

FIG. 6A~6D are schematic diagrams showing variations between voltage and temperature of the first stage amplifier 33 in FIG. 3. To a differential two-stage amplifier, the major purpose of the cascade amplifier (the first stage amplifier 33) is providing high output impedance. When the cascade amplifier is biased in the saturation region, the cascade amplifier has the high output impedance and the voltage level of the output voltage of the cascade amplifier needs to be monitored. The output voltage of the cascade amplifier is directly input to the common source amplifier, the output voltage or output current of the common source amplifier may be affected.

According to the circuit shown in FIG. 3, the current $I_5$ and $I_6$ can be expressed as following:

$$I_5 = I_1 + I_3$$

$$I_6 = I_2 + I_4$$

The currents $I_3$ and $I_4$ are duplicated by the current mirror, and the current variations of the currents $I_3$ and $I_4$ are not obvious when the temperature is not greater than 110° C. When temperature is greater than 110° C., the currents $I_3$ and $I_4$ decrease significantly. As described above, the currents $I_5$ and $I_6$ relate to the currents $I_3$ and $I_4$, and the currents $I_5$ and $I_6$ decrease when the temperature is greater than 110° C. However, when the temperature is less than 110° C., the currents $I_5$ and $I_6$ also decrease due to the reduction of currents $I_1$ and $I_2$. The reduction of currents $I_1$ and $I_2$ is due to reduction of the feedback current generated by the common feedback circuit (please refer to FIG. 5B).

Figure 6A:
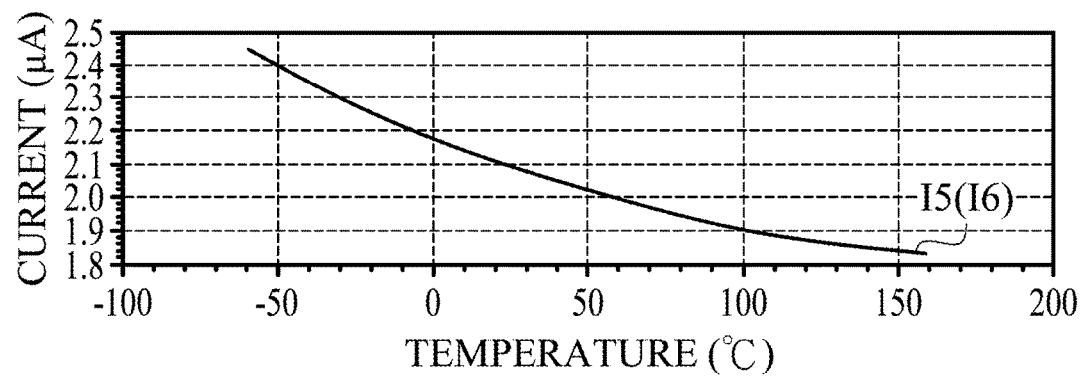
FIGS. 6A, 6B, 6C, and 6D are schematic diagrams showing variations between voltage and temperature of the first stage amplifier 33 in FIG. 3.
Figure 6B:
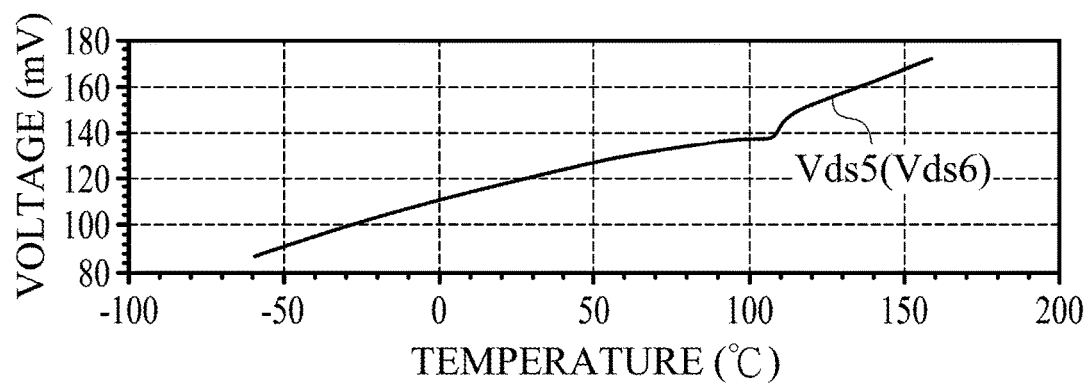
Figure 6C:
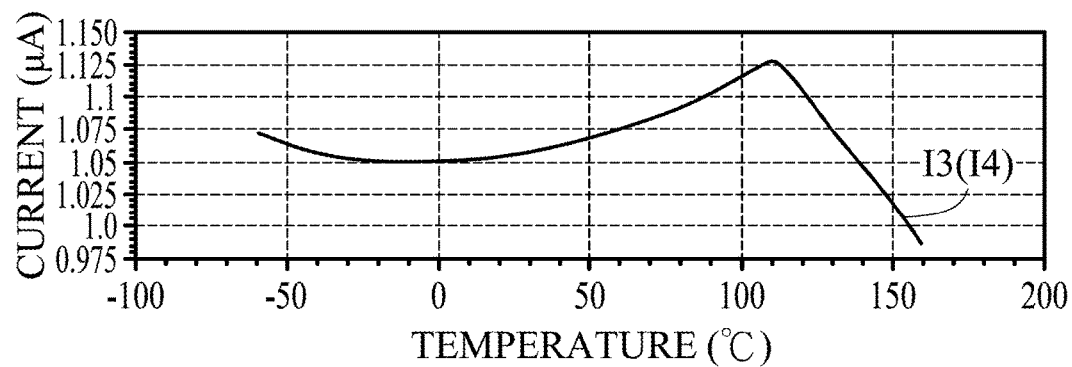
Figure 6D:
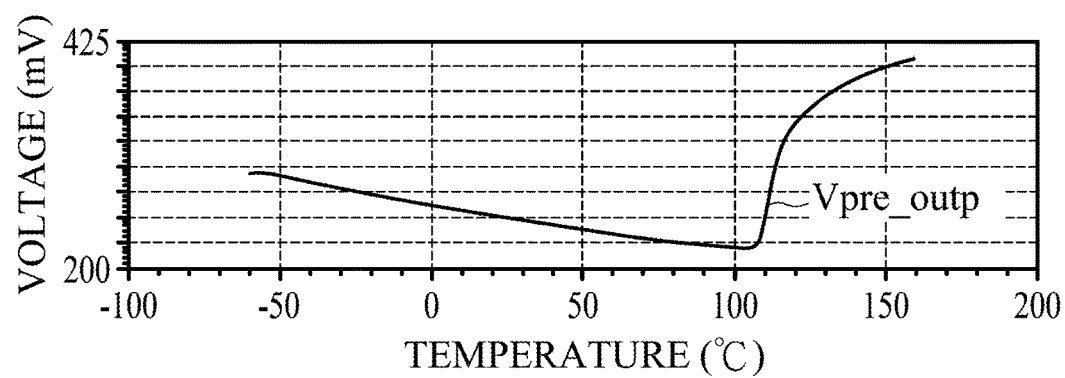

In FIG. 6C, the $V_{ds5}$ of the transistor T5 and the $V_{ds6}$ of the transistor T6 are at the saturation region under a normal operation that the temperature is less than 110° C. When the temperature increases, the threshold voltage $V_T$ decreases, the operation of transistors T3 and T4 moves to the linear region, the $V_{ds3}$ of the transistor T3 and the $V_{ds4}$ of the transistor T4 decrease accordingly. This cause the rise of the voltage $V_{ds5}$ and $V_{ds6}$. Since the $V_{ds3}$ of the transistor T3 and the $V_{ds4}$ of the transistor T4 decrease, the impedance provided by the transistors T3 and T4 decrease and a magnification ration of the first stage amplifier decreases accordingly.

Figure 7A:
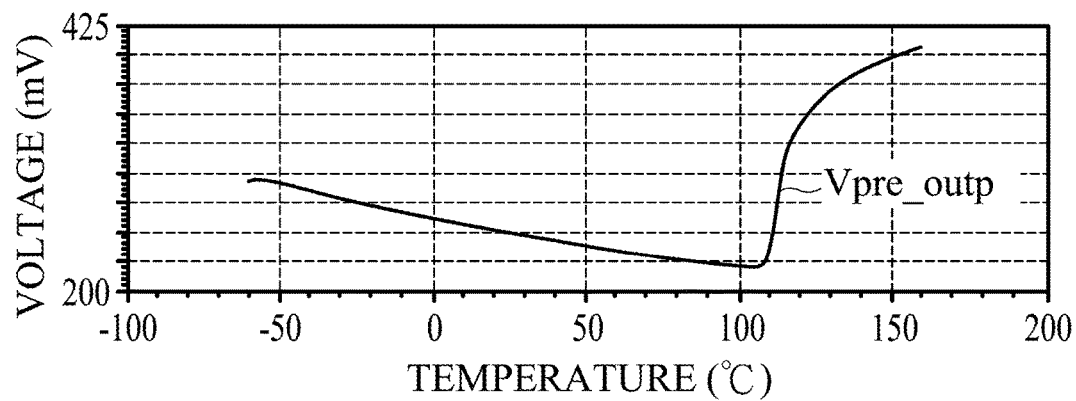
FIG. 7A & FIG. 7B are schematic diagrams showing a variation between the output voltage of the first stage amplifier and the temperature.
Figure 7B:
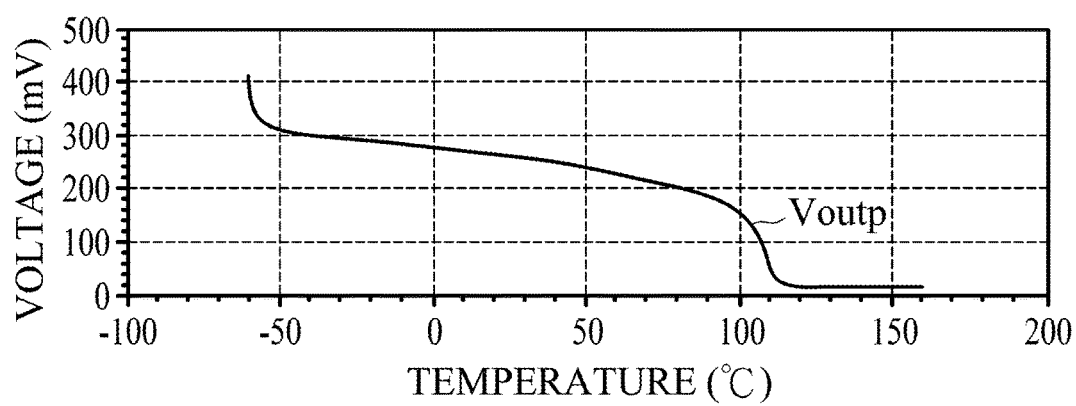

FIG. 7A is a schematic diagram showing a variation between the output voltage of the first stage amplifier and the temperature. FIG. 7B is a schematic diagram showing a variation between the output voltage of the first stage amplifier and the temperature. The voltage variation in FIG. 7A is similar to the voltage variation in FIG. 6D. When the temperature is greater than a predetermined temperature, such as 110° C., the output voltage $V_{pre-outp}$ increases due to the reduction of the $V_{ds3}$ of the transistor T3 and the $V_{ds4}$ of the transistor T4. However, the output voltage of the second stage amplifier of the differential two-stage amplifier does not increase rather the output voltage of the second stage amplifier decreases. The second stage amplifier of the differential two-stage amplifier is a common source amplifier and receives a bias current that is duplicated by a current mirror of a bias circuit. Similarly, the transistors T11 and T12 are affected by the temperature, and when the temperature increases, the $V_T$ decreases, the $V_{GS}$ of the transistors T11 and T12 increase, and thus, the operations of the transistors T11 and T12 move to the linear region. This cause the output voltage $V_{outp}$ decreases.

According to paragraphs above, it is obvious that the differential two-stage amplifier cannot work normally when the temperature is greater than a threshold temperature. Because the variation of the threshold voltage caused by the temperature variation is too large, the transistor cannot operate normally and the common mode feedback circuit cannot provide the feedback control current (Icmfb0 is decreased to zero). Therefore, it is necessary to know the threshold temperature that the common mode feedback circuit fails.

From the FIG. 2, the output voltage is transmitted to node cmfb via the common mode feedback circuit and the output voltage is then compared with the common mode voltage $V_{cm}$. The transistors T15~T22 in FIG. 3 are used to compare the common mode feedback voltage $V_{cmfb}$ and the common mode voltage $V_{cm}$. When the temperature substantially does not vary, the common mode feedback voltage $V_{cmfb}$ is substantially equal to the common mode voltage $V_{cm}$.

$$V_{cmfbT50} \approx V_{cm} \quad (3.19)$$

When the temperature increases, the common mode feedback voltage $V_{cmfb}$ is changed to $V_{cmfbHT}$, and the voltage variation is $\beta \Delta T$. The voltage variation can be expressed by the equation:

$$V_{cmfbHT} \approx \frac{2I_{D11}}{\lambda \mu_n C_{OX} \frac{W_{11}}{L_{11}}(V_{GS11} - V_{tHT})} - \frac{1}{\lambda} \approx V_{cm} - \beta \times \Delta T \quad (3.20)$$

The variation of the common mode voltage $V_{cm}$ can be represented as following:

$$\Delta V_{cmout} \approx V_{cmfbT50} - V_{cmfbHT} = \beta \times \Delta T = \Delta V_{cmfb} \quad (3.21)$$

After comparing the voltage, the input current $I_{cmfb0}$ is adjusted by a current mirror mechanism. If a transistor, such as transistor T15, enters into a cut-off region due to the large variation of $V_G$, the input current $I_{cmfb0}$ is zero. The cut-off region determination can be expressed as following:

$$V_{GS} < V_t \quad (3.22)$$

According to equation 3.22, we add the temperature parameter to determine a maximum temperature that the common mode feedback circuit can work normally. The equations to estimate the maximum temperature are listed following:

$$V_{cmfbT50} - \Delta V_{cmout} < V_{tHT} = V_{tT50} - \alpha \times \Delta T \quad (3.23)$$

$$(\beta - \alpha) \times \Delta T > V_{cmfbT50} - V_{tT50} \quad (3.24)$$

$$\Delta T > \frac{V_{cmfbT50} - V_{tT50}}{\beta - \alpha} \quad (3.25)$$

According to the equations above, we can find that the temperature variation is determined by two parts. The numerator of the equation 3.25 comprises the voltage $V_{cmfbT50}$ and the threshold voltage $Vt_{T50}$. The denominator of the equation 3.25 comprises an output voltage variation $\beta$ that is acquired by circuit simulation and a process parameter $\alpha$ that is determined when selecting a manufacture process. In this application, the output voltage variation $\beta$ is the slope between the output voltage $V_{outp}$ at 50° C. and the output voltage $V_{outp}$ at −30° C. In the described equation, $V_{cmfbT50}$ is the value of the voltage $V_{cmfb}$ at 50° C. and $Vt_{T50}$ is the value of Vt at 50° C.

In other words, after designing the differential two-stage amplifier, a temperature tolerable range ΔT of the common mode feedback circuit and a threshold temperature (T+ΔT) that the differential two-stage amplifier cannot work normally can be estimated, wherein T is 50° C. in this embodiment.

As described above, the reason that the differential two-stage amplifier cannot work normally is the common mode feedback circuit cannot provide currents to adjust the input current of the differential two-stage amplifier. Thus, a current compensation mechanism is provided to solve the issue that the common mode feedback circuit cannot provide currents to adjust the input current of the differential two-stage amplifier at a high temperature.

Figure 8:
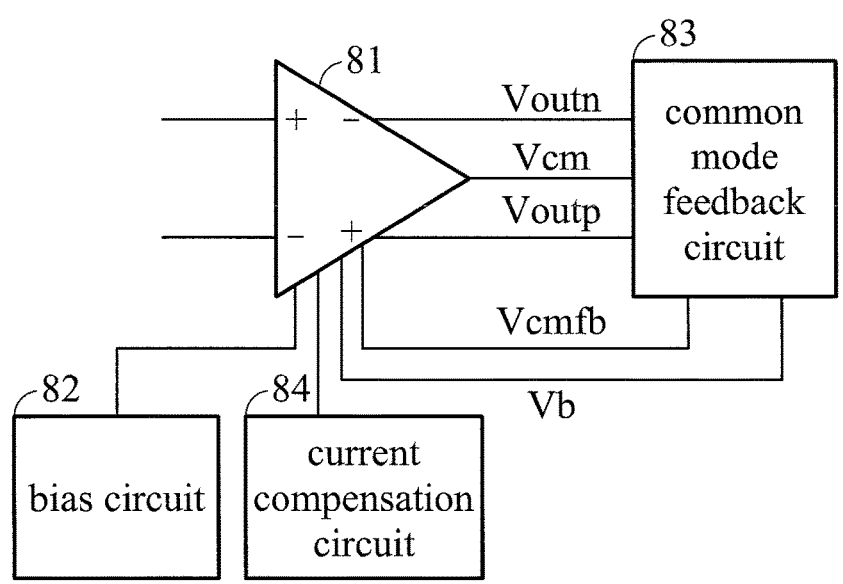
FIG. 8 is a schematic diagram of a differential two-stage amplifier with current compensation mechanism according to an embodiment of the invention.

FIG. 8 is a schematic diagram of a differential two-stage amplifier with current compensation mechanism according to an embodiment of the invention. The differential two-stage amplifier comprises a dual output amplifier 81, a common mode feedback circuit 83, a current compensation circuit 84 and a bias circuit 82. The bias circuit 82 is made up of a Bandgap circuit and a current generation circuit to bias the dual output amplifier 81. The common mode feedback circuit 83, such as shown in FIG. 2, is a common technology applied to the differential two-stage amplifier. The common mode feedback circuit 83 detects a variation of the voltage level of the common mode voltage of the output terminals of the dual output amplifier 81 and adjusts the input current of input stage of the dual output amplifier 81 to avoid the differential two-stage amplifier affecting by the temperature. The common mode voltage is provided by at least one external circuit.

When the temperature is greater than a predetermined temperature, such as 110° C., the common mode feedback circuit 83 cannot provide enough current to adjust the input current of the differential two-stage amplifier. To avoid the defect, the current compensation circuit 84 provides a compensation current to the input stage of the differential two-stage amplifier to ensure the differential two-stage amplifier can work normally. The current compensation circuit 84 can be implemented by many kinds of circuits or devices. To avoid excessive circuits causing the differential two-stage amplifier to generate more heat, which causes the temperature of circuits increases more quickly, an embodiment of the invention uses the leakage current of transistor to compensate the input current of the differential two-stage amplifier. In other embodiments, the current compensation can be achieved by other current compensation circuits.

Simply speaking, when the temperature of the differential two-stage amplifier is under a predetermined temperature, the dual output amplifier 81 receives currents provided by the bias circuit 82 and the common mode feedback circuit 83. When the temperature of the differential two-stage amplifier is higher than the predetermined temperature, the dual output amplifier 81 receives currents provided by the bias circuit 82 and the current compensation circuit 84.

Figure 9:
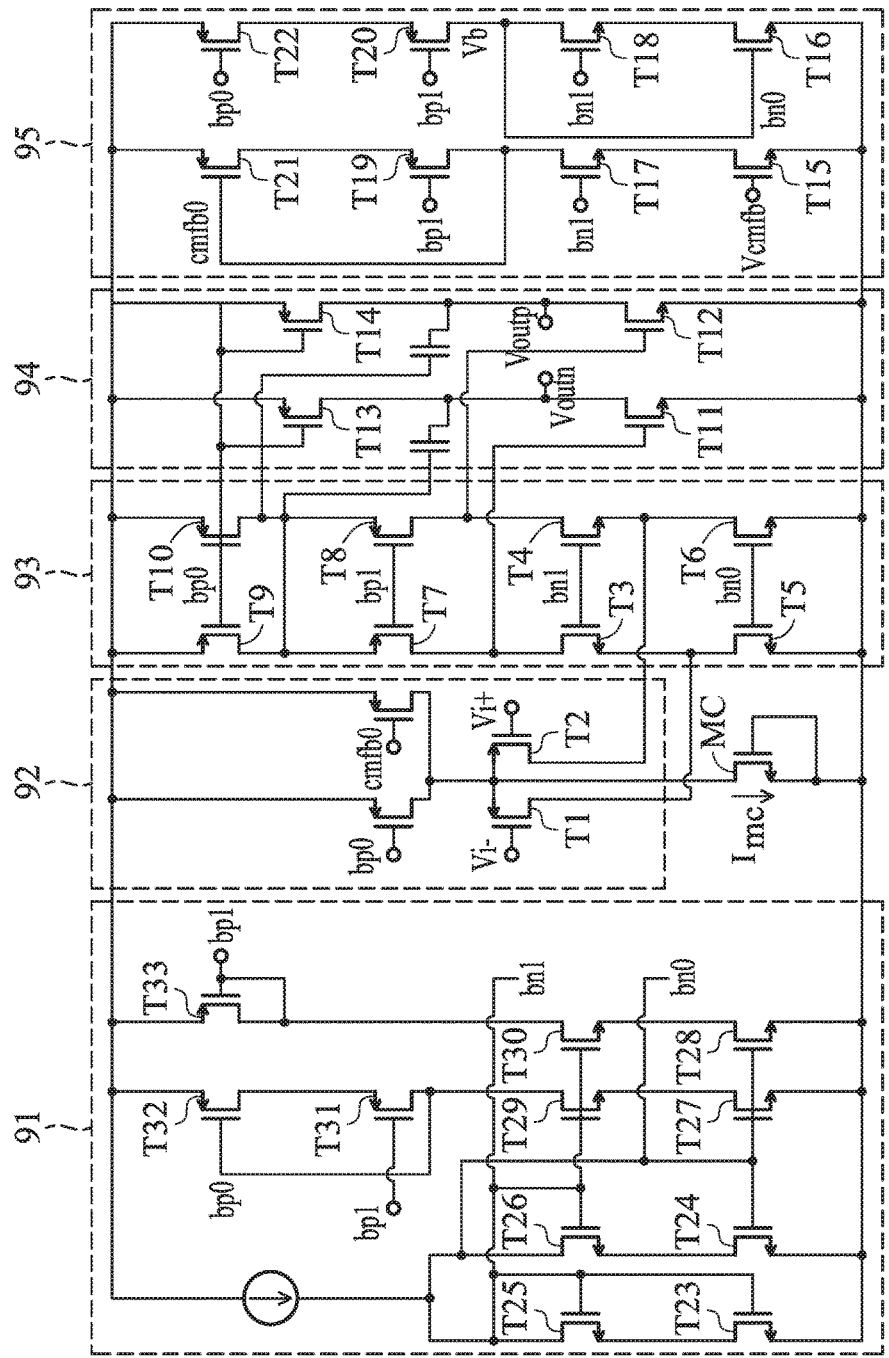
FIG. 9 is a schematic diagram of a differential two-stage amplifier with current compensation transistor according to an embodiment of the invention.

FIG. 9 is a schematic diagram of a differential two-stage amplifier with current compensation transistor according to an embodiment of the invention. The differential two-stage amplifier comprises a bias circuit 91, an input stage circuit 92, a first stage amplifier 93, a second stage amplifier 94, a common mode feedback circuit 95, and a current compensation transistor MC. The bias circuit 91 generates different bias currents and transmits the bias currents to other circuits, such as the input stage circuit 92. The first stage amplifier 93 is a cascade amplifier to amplify the input signals Vi+ and Vi−. The reason to choose the cascade amplifier is that the cascade amplifier can increase the input signal swing of the input signal, and the cascade amplifier has a large magnification ratio. The second stage amplifier 94 is a common source amplifier to amplify the output signal of the first stage amplifier 93 to increase output signal swing. The common mode feedback circuit 95 adjusts the bias current $I_{cmfb0}$ of the first stage amplifier 93 according to variation of the common mode voltage.

Since the leakage current increases when the temperature increases, the leakage current can be provided to the input stage circuit 92 under a high temperature condition. When the circuits operate at a room temperature, the leakage current is not obvious and the leakage current does not affect the differential two-stage amplifier. The bias current $I_{cmfb0}$ is not zero due to the leakage current provided by the current compensation transistor MC, and the differential two-stage amplifier does not fail due to the high temperature accordingly.

Figure 10A:
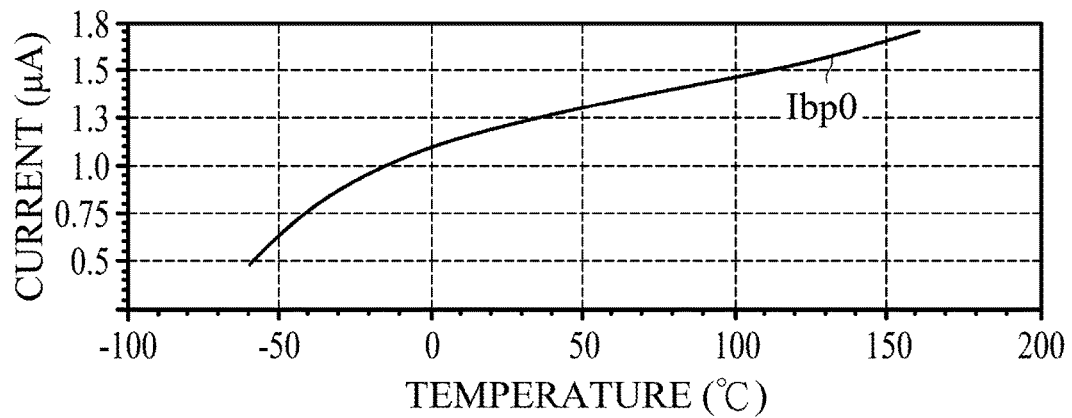
FIGS. 10A, 10B, 10C, and 10D are schematic diagrams showing variations between current and temperature of the differential two-stage amplifier of FIG. 9.
Figure 10B:
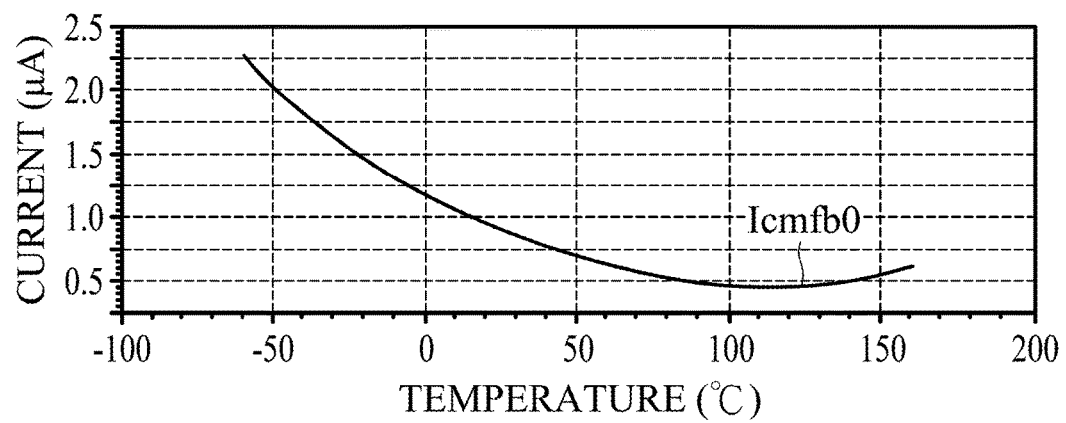
Figure 10C:
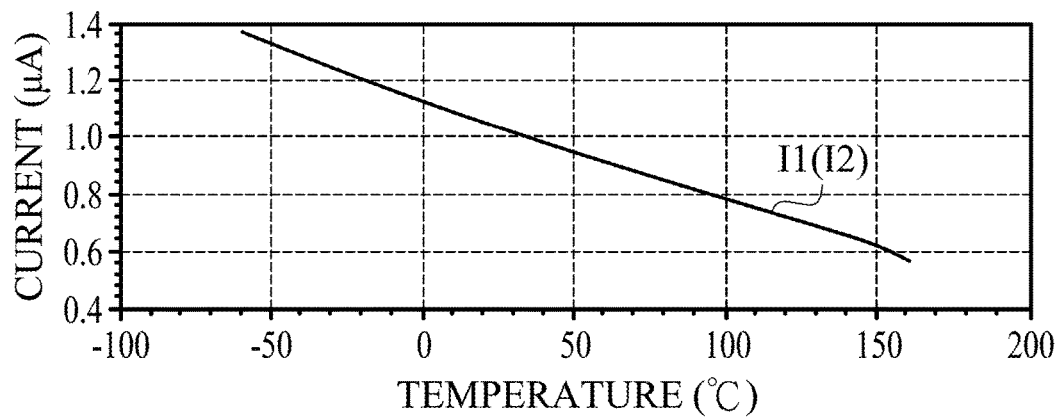
Figure 10D:
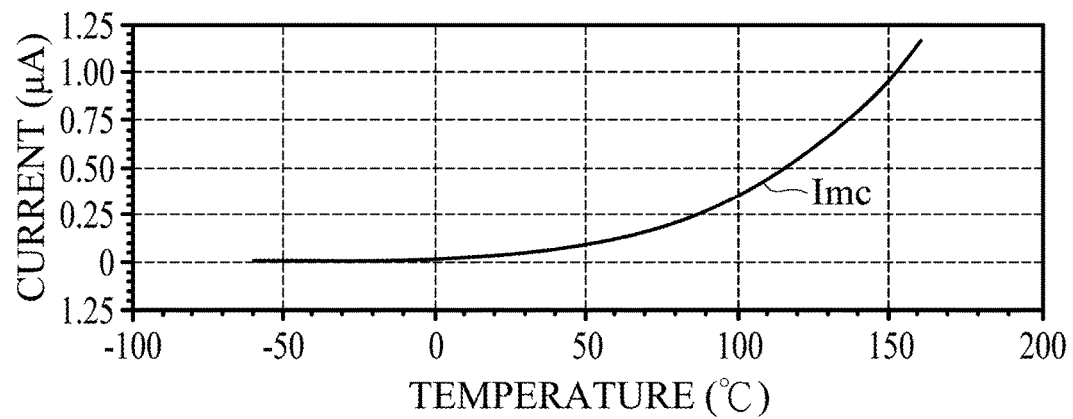

In the circuit of FIG. 9, the leakage current Imc provided by the current compensation transistor MC is served as a current source of the input stage circuit 92 and the current $I_{cmfb0}$ will not become to zero because the leakage current Imc can compensate the loss of the current $I_{cmfb0}$ when the temperature of circuits is greater than a predetermined temperature. Thus, the common mode feedback circuit 95 can operate normally because the current $I_{cmfb0}$ will not decrease due to the high temperature. The input current variation after compensating can be referred to FIGS. 10A~10D. In FIGS. 10B and 10D, the leakage current Imc provided by the current compensation transistor MC effectively compensates the loss of the current $I_{cmfb0}$.

As how to choose the current compensation transistor MC, the following paragraphs can be a reference.

Since we use the leakage current to compensate the current $I_{cmfb0}$, the current compensation condition is set the leakage current to be substantially equal to the current $I_{cmfb0}$. The current $I_{cmfb0}$ is generated by a current mirror and is equal to the current passing through the transistor M15. The current variation can be expressed as the equation:

$$I_D = \mu V_T^2 \frac{W}{L} \exp\left(\frac{V_{GS} - V_{th}}{mV_T}\right)\left(1 - e^{\frac{-V_{DS}}{V_T}}\right) = \Delta I_{cmfb} = \Delta I_{15} \quad (3.26)$$

Then, the current variation of the current $I_{cmfb0}$ is substituted into the current estimation equation at the saturation region. The voltage on the node cmfb is $V_{cmfbHT}$ when the temperature is at a high temperature. In this embodiment, we use a reference voltage, $V_{cmfbT50}$, which is the voltage of the node cmfb when the temperature is at 50° C. The threshold voltages $V_{tHT}$ and $V_{tT50}$ are the threshold voltage when the temperature is at a high temperature or 50° C. The variation of the current $I_{15}$ can be expressed by the equation:

$$\Delta I_{15} = \quad (3.27)$$
$$\frac{1}{2}\mu_n C_{OX} \frac{W_{15}}{L_{15}}(1 + \lambda V_{DS15})[(V_{cmfbT50} - V_{tT50})^2 - (V_{cmfbHT} - V_{tHT})^2]$$

We add the temperature affect to the equation above to get the following equations:

$$\Delta I_{15} = \frac{1}{2}\mu_n C_{OX} \frac{W_{15}}{L_{15}}(1+\lambda V_{DS15})[(V_{cmfbT50} - V_{tT50})^2 - \quad (3.28)$$
$$(V_{cmfbT50} - \beta\Delta T - V_{tT50} + \alpha\Delta T)^2]$$
$$= \frac{1}{2}\mu_n C_{OX} \frac{W_{15}}{L_{15}}(1+\lambda V_{DS15})\{[(\beta-\alpha)\times\Delta T]^2 + \quad (3.29)$$
$$2(V_{cmfbT50} - V_{tT50})(\beta-\alpha)\times\Delta T\}$$

To ensure the current compensation mechanism is workable, the sum of the current $T_{cmfbCM}$ at a basis temperature (50° C.) and the leakage current needs to be larger than the current variation $\Delta I_{15}$. It can be expressed as the equation:

$$I_{cmfbCM} - \Delta I_{15} + I_{mc} > 0 \quad (3.30)$$

According to the equations above, the size of the current compensation transistor MC can be expressed:

$$\frac{W_{mc}}{L_{mc}} \times \frac{L_{15}}{W_{15}} > \frac{C_{OX}(1+\lambda V_{DS15})\{[(\beta-\alpha)\times\Delta T]^2 + 2(V_{cmfb} - V_{tT50})(\beta-\alpha)\times\Delta T\} - \frac{2I_{cmfbCM}}{\mu_n}}{2V_T^2\exp\left(\frac{-V_{th}}{mV_T}\right)} \quad (3.31)$$

According to the equation 3.31, we can substitute different parameters, such as α, β, according to the process, the voltage $V_{DS}$, the current $I_{cmfbCM}$, into the equation 3.31 to adjust the size of the transistor to meet every condition.

Since the leakage current increases in exponential and the common mode voltage circuit can work normally when the current $T_{cmfb0}$ is not zero. When we estimate an optimal size of the transistor, we can get a maximum compensation current, and the size of the transistor corresponding to the maximum compensation current is the optimal size of the transistor, such as shown in FIG. 11.

Figure 11:
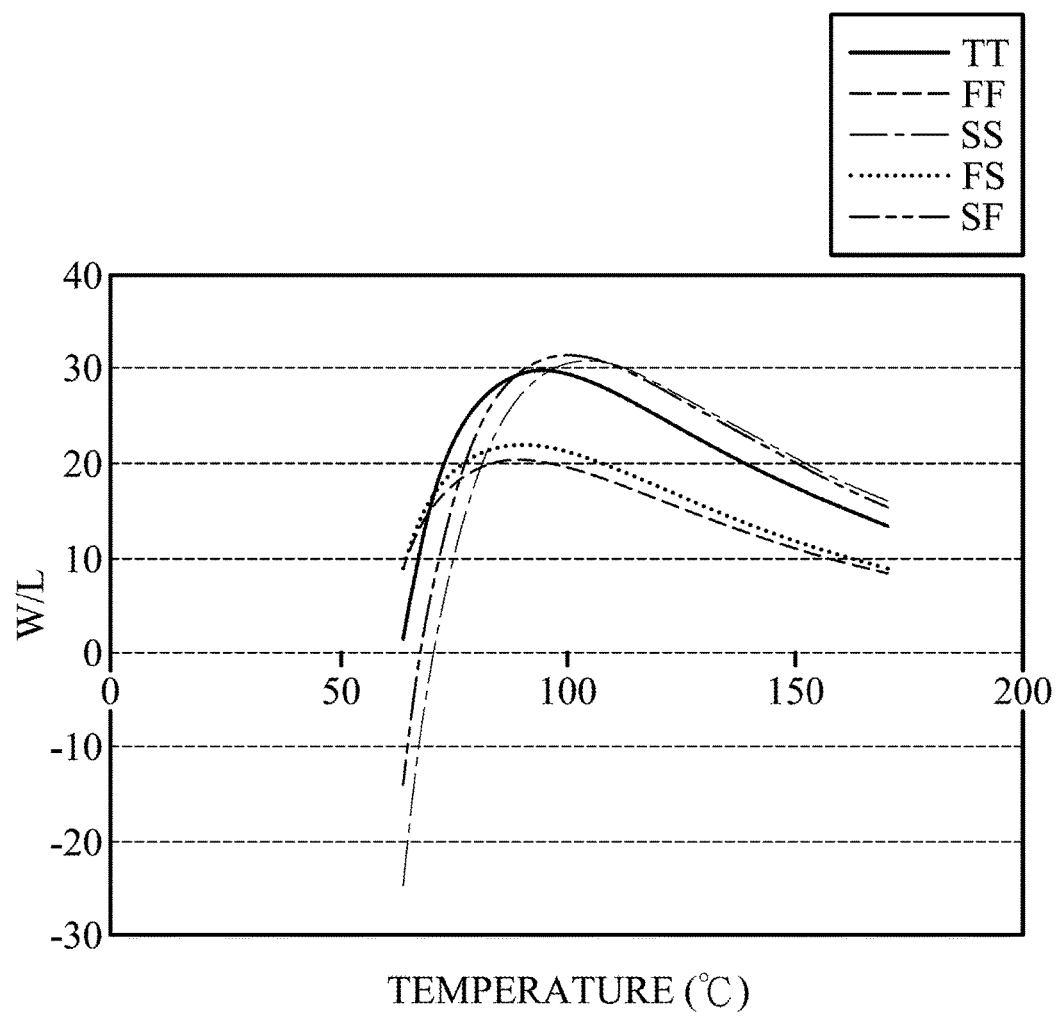
FIG. 11 is a schematic diagram showing a relation between the temperature and a W/L ration of the current compensation transistor.

In FIG. 11, when the temperature is substantially equal to 100° C., the size of the transistor MC is largest. The temperature, 100° C., is substantially the same as the temperature corresponding to a minimum value of the current $I_{cmfb0}$ but is different from the temperature, such as 110° C. in FIG. 5B, corresponding to minimum value of the current $I_{cmfb0}$ without current compensation.

Figure 12A:
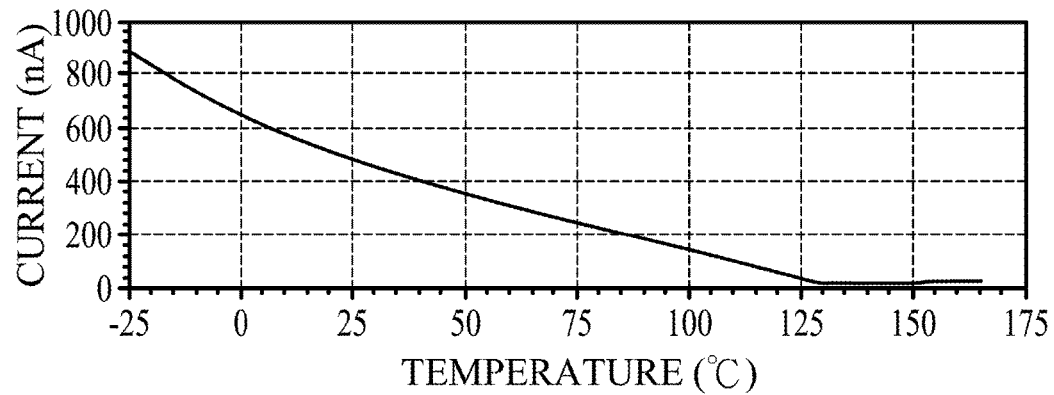
FIG. 12A and FIG. 12B are schematic diagram showing the current Icmfb of the differential two-stage amplifier.
Figure 12B:
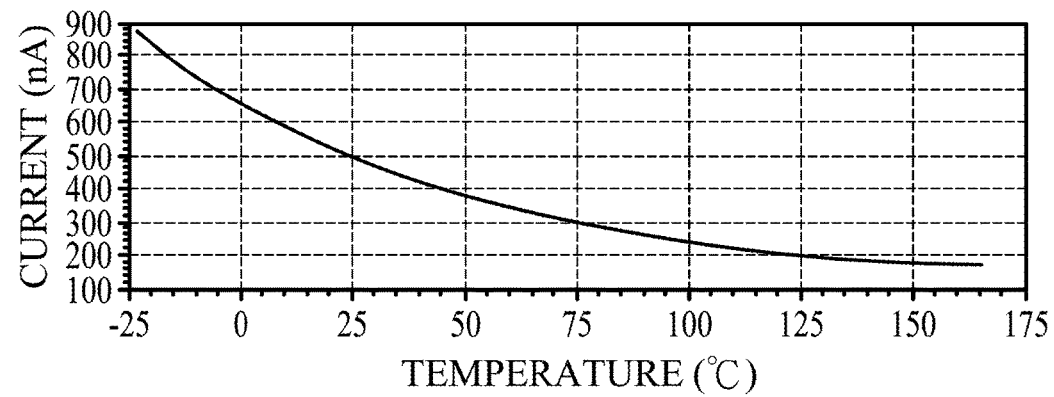

FIGS. 12A and 12B are schematic diagram showing the current $I_{cmfb0}$ of the differential two-stage amplifier. FIG. 12A shows the variation between the temperature and the current $I_{cmfb}$ without the current compensation transistor. It is obvious that when the temperature is at 125°, the current $I_{cmfb}$ is substantially equal to zero. FIG. 12B shows the variation between the temperature and the current $I_{cmfb}$ with the current compensation transistor. It is found that when the temperature is at 125° C., the current $I_{cmfb}$ will not be pulled down to zero, and the common mode feedback circuit can be work normally.

Figure 13:
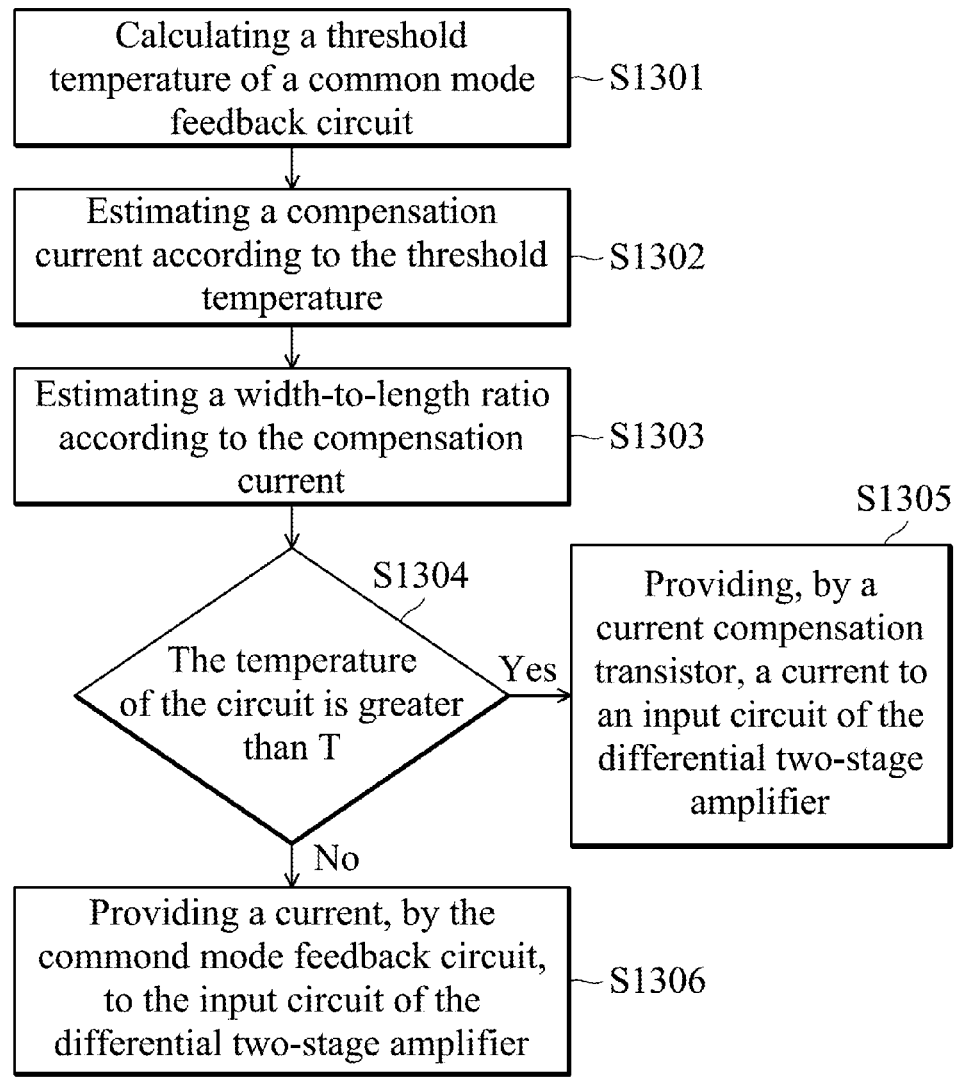
FIG. 13 is a flowchart of an operation method of a differential two-stage amplifier.

FIG. 13 is a flowchart of an operation method of a differential two-stage amplifier according to an embodiment of the invention. The differential two-stage amplifier comprises a bias circuit, an input circuit, a first stage amplifier, a second stage amplifier, a common mode feedback circuit, and a current compensation transistor. In step S1301, a threshold temperature T of the common mode feedback circuit is estimated. When the temperature of the circuit board is larger than the threshold temperature T, the common mode feedback circuit cannot provide the current to the input stage circuit, and the differential two-stage amplifier cannot work normally. In step S1302, compensation current is estimated according to the threshold temperature T. In step S1303, the width-length ratio (W/L) is estimated according to the compensation current.

In step S1304, a circuit or a device determine whether the temperature of the circuit is greater than the threshold temperature T. If the temperature of the circuit is greater than T, step S1305 is executed. In this situation, the common mode feedback circuit cannot provide current to the input stage circuit, thus, the input stage circuit receives the current from the current compensation transistor. In this embodiment, the current compensation transistor is designed according to the characteristic of the leakage current. The current compensation transistor provides compensation current when the temperature of the circuit is greater than the threshold temperature T. The magnitude of the leakage current is not obvious when the temperature of the circuit is low. Thus, the situation that the current compensation transistor provides excessive current to the input stage circuit will not happen. If the temperature of the circuit is greater than T, step S1306 is executed. The common mode feedback circuit provides current to the input stage circuit.

In the paragraph described above, we note that the more integrated circuits we use, the more heat the circuits generate, and the differential two-stage amplifier is affected by the temperature. The invention uses the leakage current to compensate current that the common mode voltage cannot provide at a high temperature. A person skilled in the art can design specific circuit to compensate the input current of the differential two-stage amplifier. For example, the person skilled in the art uses a detection circuit to detect the common mode feedback current output by the common mode feedback circuit. When the common mode feedback current is less than a predetermined value, a current generation circuit generates the compensation current and transmits the compensation current to the input stage circuit of the differential two-stage amplifier. In another embodiment, a temperature detection circuit is used to detect the temperature of the differential two-stage amplifier. When the temperature of the differential two-stage amplifier is greater than a threshold temperature T, a current generation circuit generates the compensation current and transmits the compensation current to the input stage circuit of the differential two-stage amplifier. When the temperature of the differential two-stage amplifier is less than a threshold temperature T, the common mode feedback circuit provides the common mode feedback current to the input stage circuit of the differential two-stage amplifier.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A differential two-stage amplifier, comprising:
   an input circuit to receive an input current;
   a bias circuit coupled to the input circuit to generate a bias current;
   a first stage amplifier coupled to the input circuit;
   a second stage amplifier coupled to the first stage amplifier;
   a common mode feedback circuit coupled to the second stage amplifier and adjusts a common mode feedback current according to a common mode voltage, wherein the input current is made up of the bias current and the common mode feedback current; and a current compensation circuit to provide a compensation current, wherein when a temperature of the differential two-stage amplifier is greater than a predetermined temperature, the common mode feedback current is substantially equal to zero and the compensation current is input to the input circuit to compensate loss of the common mode feedback current.

2. The differential two-stage amplifier as claimed in claim 1, wherein the first stage amplifier is a cascade amplifier.

3. The differential two-stage amplifier as claimed in claim 1, wherein the second stage amplifier is a common source amplifier.

4. The differential two-stage amplifier as claimed in claim 1, wherein the compensation current is a leakage current provided by a transistor of the current compensation circuit.

5. The differential two-stage amplifier as claimed in claim 1, wherein the predetermined temperature is estimated based on a temperature parameter of a threshold of at least one transistor of the common mode feedback circuit.

6. The differential two-stage amplifier as claimed in claim 5, wherein the temperature parameter relates to a manufacture process of the transistor.

7. The differential two-stage amplifier as claimed in claim 1, wherein the current compensation circuit is a transistor.

8. The differential two-stage amplifier as claimed in claim 7, wherein a width-length ratio of the transistor is determined based on the compensation current.

9. An operational method for a differential two-stage amplifier, the method comprising:
   calculating a threshold temperature that a common mode feedback circuit of a differential two-stage amplifier works normally;
   estimating a compensation current according to the threshold temperature;
   providing a common mode feedback current to an input circuit of the differential two-stage amplifier when a temperature of the differential two-stage amplifier is lower than the threshold temperature; and
   stopping providing the common mode feedback current to the input circuit and receiving a compensation current, by the input circuit, from a current compensation circuit when the temperature of the differential two-stage amplifier is greater than the threshold temperature.

10. The method as claimed in claim 9, wherein the current compensation circuit is a transistor.

* * * * *